United States Patent [19]

Scheele

[11] Patent Number: 5,914,664
[45] Date of Patent: Jun. 22, 1999

[54] OPTICALLY SENSING AUXILIARY SWITCH

[75] Inventor: John L. Scheele, Greenfield, Wis.

[73] Assignee: Allen-Bradley Company, LLC, Milwaukee, Wis.

[21] Appl. No.: 08/888,217

[22] Filed: Jul. 3, 1997

[51] Int. Cl.⁶ .................................................. G08B 21/00
[52] U.S. Cl. ...................... 340/644; 340/686.3; 340/555; 340/556; 340/693.9; 340/635; 250/559.4; 250/208.4; 250/222.1; 307/117; 307/125; 335/17
[58] Field of Search ..................................... 340/644, 555, 340/556, 693, 600, 635, 638, 686, 688; 250/559.4, 208.4, 222.1; 307/117, 125; 335/17

[56] References Cited

U.S. PATENT DOCUMENTS

| | | | |
|---|---|---|---|
| 3,446,981 | 5/1969 | Ackerman et al. | 340/688 |
| 4,451,910 | 5/1984 | Simard | 367/199 |
| 4,698,621 | 10/1987 | Masot | 340/639 |
| 4,706,073 | 11/1987 | Vila Masot | 340/639 |
| 5,233,330 | 8/1993 | Hase | 340/638 |
| 5,493,278 | 2/1996 | Mackenzie et al. | 340/638 |
| 5,585,678 | 12/1996 | Kijk et al. | 307/112 |

OTHER PUBLICATIONS

Selected pages from Allen–Bradley Industrial Controls catalog; pp. 3–5 and 3–38; believed first published prior to Jul. 3, 1996.

Rudolf F. Graf, Encyclopedia of Electronic Circuits vol. 2, Fig. 89–8: "Siren uses TTL Gates", p. 576, Copyright 1988.

Primary Examiner—Benjamin C. Lee
Attorney, Agent, or Firm—Patrick S. Yoder; John M. Miller; John J. Horn

[57] ABSTRACT

An auxiliary switch provides an output or feedback signal indicative of the position or logical state of a contactor, disconnect or other principal device to which it is coupled. The switch is formed as a modular unit which can be fixed directly to the principal device, and is actuated by movement of elements within the principal device. An optical switch set within the auxiliary switch includes an emitter and detector pair aligned in mutually facing relation. An actuator is movable with the principal device and supports an optical shield. The actuator displaces the shield between a position clear of the optical path and a position interposed between the emitter and detector to change the state of the auxiliary switch. A power supply circuit may be housed within the switch for supplying power to the optical switch and to output circuitry. The device is particularly tolerant to contamination and can reliably output low level logic signals indicative of the state of the principal device.

20 Claims, 4 Drawing Sheets

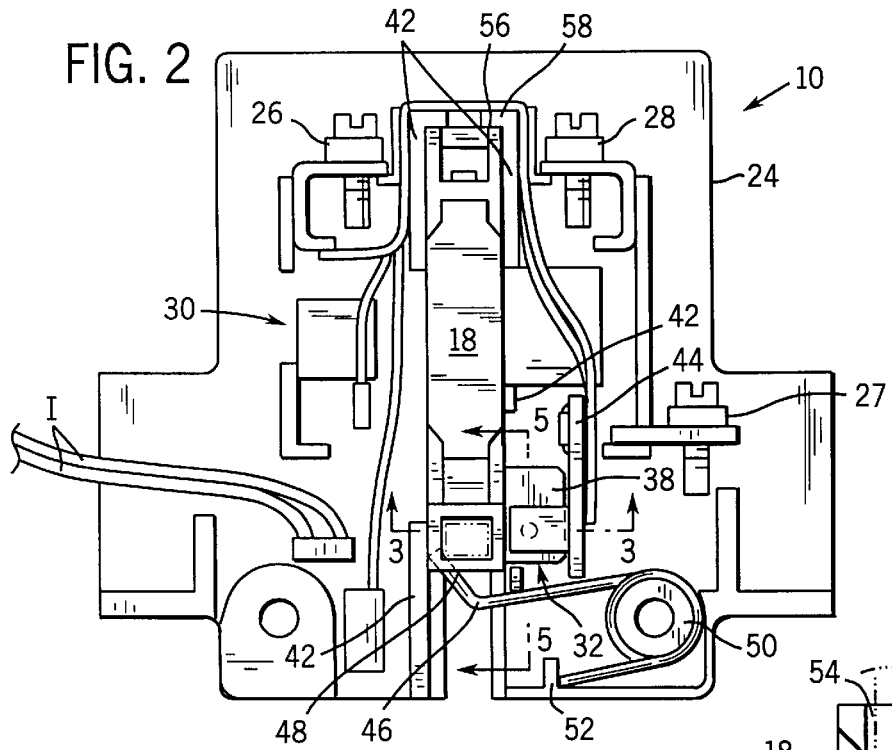
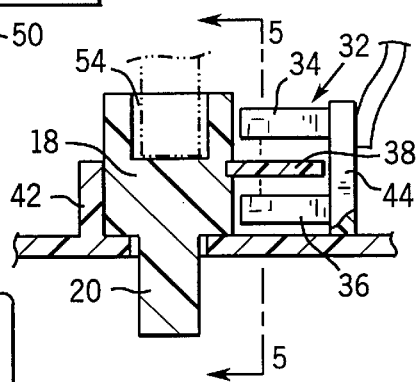
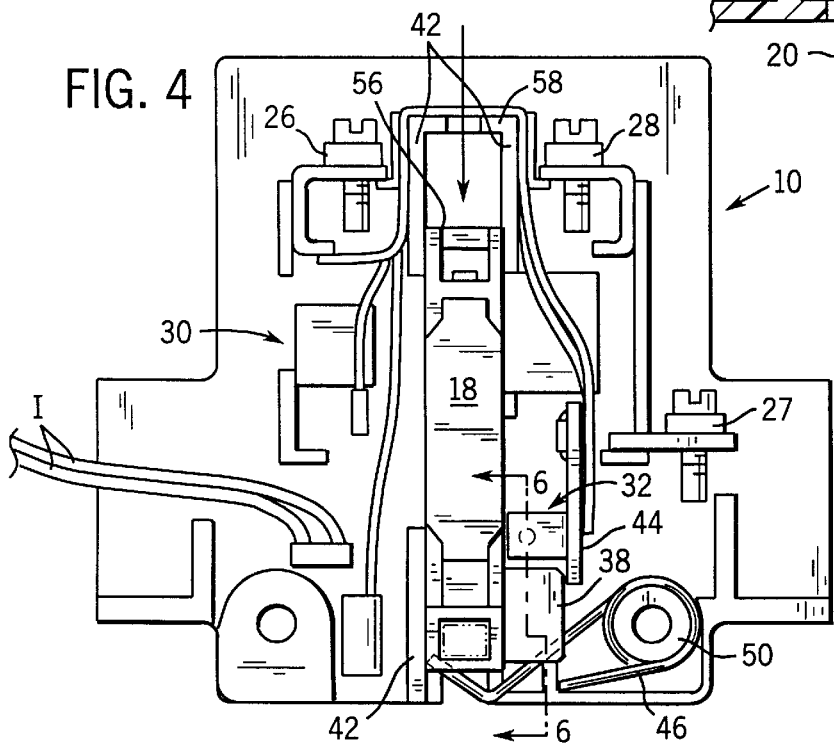

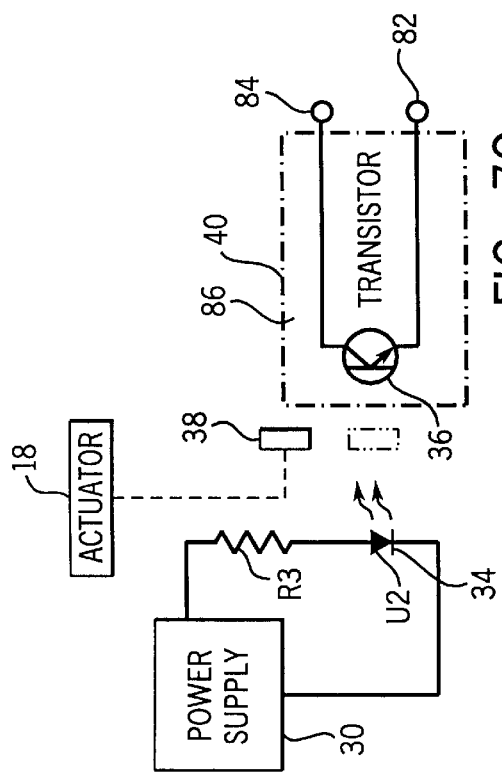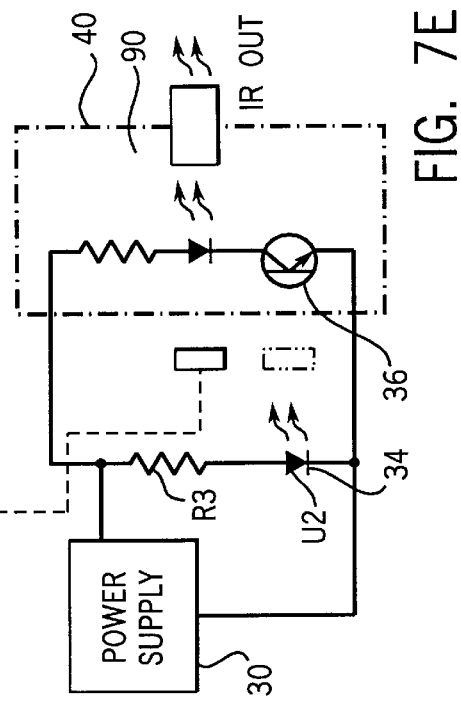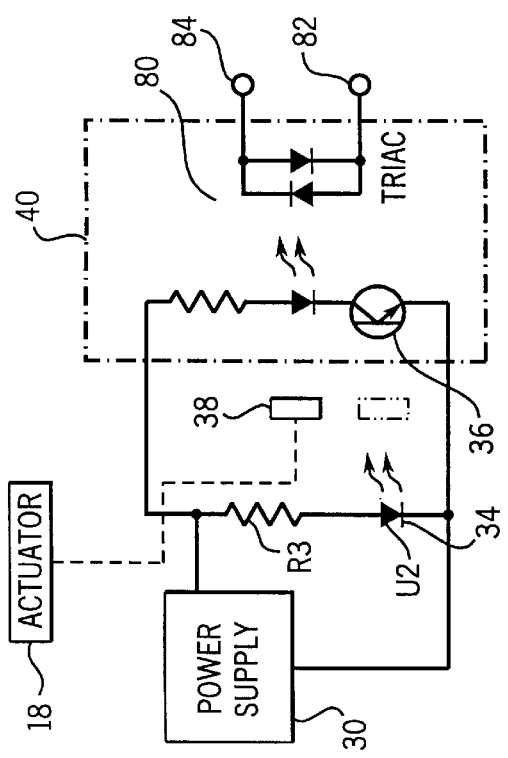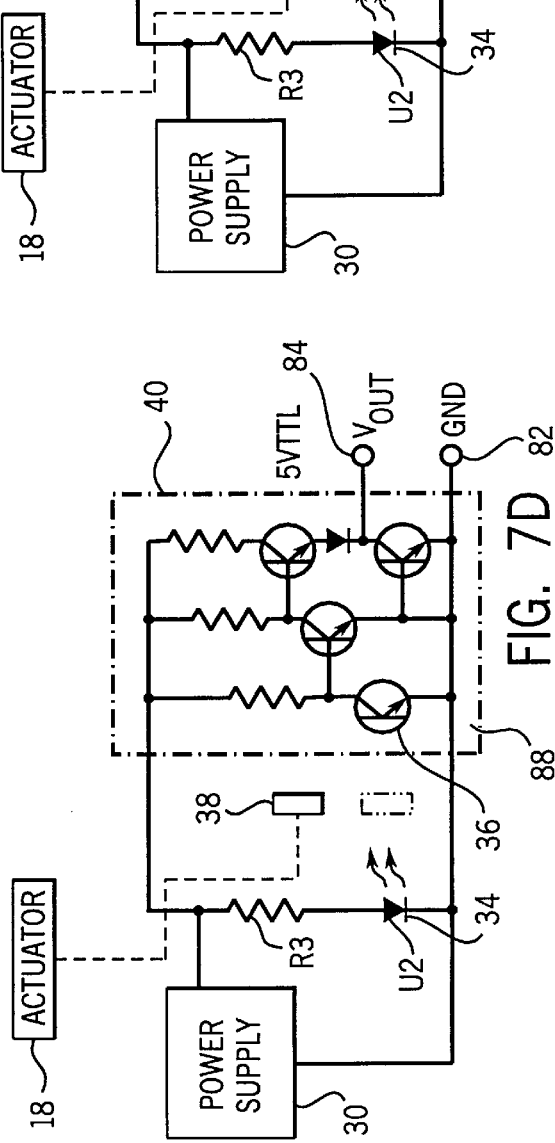
FIG. 7C
FIG. 7E
FIG. 7B
FIG. 7D

OPTICALLY SENSING AUXILIARY SWITCH

BACKGROUND OF THE INVENTION

1. Field of the Invention

The present invention relates generally to the field of auxiliary switches for indicating the position or state of a principal apparatus, such as an interrupter, contactor, switch, disconnect or the like. More particularly, the invention relates to a novel technique for optically sensing the position or state of a switch or other moveable device, capable of providing feedback or monitoring signals indicative of the state.

2. Description of Related Art

In the field of electrical contactors and similar devices, it is generally known to monitor and feedback electrical signals indicative of the position or actual state of moveable contacts or other moveable elements within the device. Because such devices are often remotely controlled, and may inadvertently be switched from one state to another, or malfunction by remaining in an undesired state, the feedback and monitoring signals provide operators and system controllers with information useful for confirming proper operation of the devices or for flagging improper operation.

In one known technique for providing a feedback signal of this type, an auxiliary switch is attached to the principal device, such as a contactor. An auxiliary switch actuator is coupled to the movable elements of the contactor. As the contactor is shifted between conducting and non-conducting positions, the movable elements of the contactor carry with them a moveable contact element or spanner attached to the actuator within the auxiliary switch housing. The auxiliary switch is thus also physically shifted between conducting and non-conducting positions. In the conducting position of the auxiliary switch, the movable contact element abuts stationary contacts to complete a current carrying path between the auxiliary switch leads. The leads may be wired to monitoring circuitry for normally open or normally closed operation so as to apply or interrupt an electrical signal indicative of the actual position of the principal device. An auxiliary switch generally of this type is available from the Allen-Bradley Company of Milwaukee, Wis. under the commercial designation Bulletin 195.

While such devices are useful in providing feedback and monitoring signals, they are not without drawbacks. In particular, depending upon the voltage applied to the auxiliary switch, the electrical contact required to reliably provide the feedback signal may not be ensured. Moreover, because environments in which such auxiliary devices are applied may be relatively harsh, dirt and debris accumulating on stationary or moveable contacts in the auxiliary switch may prevent the conducting path through the device from being reliably established. Where the voltage level applied to the auxiliary switch is sufficient to generate arcs as the moveable and stationary contacts are joined and separated, such dirt and debris may be cleared from the conducting path. However, in an increasing number of devices the voltage levels applied to the auxiliary switch are too low (e.g., 5 volts d.c.) to provide sufficient arcing for clearing the debris from the mating conductors. In addition, in certain applications, it may be undesirable to complete a physical contact between stationary and moveable contacts or to generate path-clearing arcs in order to generate a feedback or monitoring auxiliary signal.

There is a need, therefore, for an improved auxiliary switch which does not rely upon physical contact between moveable switching elements to provide feedback and monitoring signals indicative of the actual position or state of a principal device such as an electrical contactor. In particular, there is a need for an improved technique of generating feedback signals indicative of the state of such principal devices which is resistant to contamination in harsh environments and provides reliable feedback signals, particularly for automatic control systems integrated with the principal and auxiliary devices. Moreover, there is a need for a relatively compact, economical auxiliary switching device which can be utilized with contactors and other principal devices of existing design in a relatively straightforward manner.

SUMMARY OF THE INVENTION

The present invention provides a novel technique for generating an auxiliary signal indicative of the position or state of a principal device. In accordance with the technique, the position of an actuator in an auxiliary device is sensed through optical means requiring no direct physical contact between switching elements. The actuator may be coupled mechanically to a moveable element in a primary device, such as an electrical contactor, so as to move with the moveable elements of the principal device in response to either manual or remote operation thereof. The position of the actuator is then sensed optically to either complete or interrupt an optical path within the auxiliary device. The auxiliary device may be coupled in normally open or normally closed configurations so as to provide or interrupt the feedback signal, thereby providing an indication of the position or state of the principal device. In a particularly preferred embodiment, a moveable optical shield is coupled to the actuator and is moved between an optical emitter/detector set to selectively complete or interrupt a signal path within the auxiliary device. The resulting arrangement is particularly insensitive to debris and contamination. Moreover, because no physical contact need be made within the device, a reliable feedback or monitoring signal is provided for even low voltage feedback circuits.

Thus, in accordance with the first aspect of the invention, an auxiliary switch is provided for generating a signal indicative of a state of a principal switching device. The principal switching device includes an enclosure and a movable element displaceable within the enclosure to establish first and second states of the principal switching device. The auxiliary switch includes an actuator, an optical switch set and an optical shield. The actuator includes an interface element configured for coupling to the principal switching device movable element. The interface element moves the actuator with the movable element. The optical switch set includes an emitter and a detector. The optical shield is coupled to the actuator, and is movable with the actuator. In a first position the optical shield interrupts an optical path between the emitter and detector to provide an indication of the first state of the principal switching device. In a second position the shield is interposed between the emitter and detector, opening the optical path, and thereby providing an indication of the second state of the principal switching device.

In accordance with another aspect of the invention, a modular auxiliary switch is provided that includes a modular housing, an actuator, an optical switch, and an optical shield. The modular housing is configured to be coupled to the enclosure of a principal switching device. The actuator is movable within the modular housing and includes an interface element configured for coupling to the principal switching device movable element. The interface element moves the actuator with the movable element. The optical switch set is disposed within the modular housing and includes an emitter and a detector. The optical shield is disposed within the modular housing and is coupled to the actuator. The shield is movable with the actuator to selectively open and close an optical path between the emitter and detector, and thereby to provide an indication of the state of the principal switching device.

The invention also provides a method for monitoring an operating state of a principal switching device. In accordance with the method, an optical switching unit is coupled to the principal switching device. The optical switching unit includes an optical switch and an optical shield. The optical switch, in turn, includes an optical emitter and an optical receiver. An optical path is established between the optical emitter and the optical receiver. The optical path is selectively interrupted by the optical shield based upon the state of the principal switching device. An output signal is generated that is representative of whether the optical path is open or closed to provide an indication of the state of the principal switching device.

BRIEF DESCRIPTION OF THE DRAWINGS

The present invention will become more fully understood from the following detailed description, taken in conjunction with the accompanying drawings, wherein like reference numerals refer to like parts, in which:

FIG. 2 is a side elevational view of the auxiliary switch of FIG. 1 with one side panel removed to show the internal features of the switch in a presently preferred embodiment;

FIG. 3 is a sectional view of a portion of the auxiliary switch taken along line 3—3 of FIG. 2, showing an exemplary placement of an optical emitter, detector and shield for providing an indication of a first state of a principal device to which the auxiliary switch is coupled;

FIG. 4 is a side elevational view of the auxiliary switch of FIG. 2 wherein the actuator and optical shield have been displaced to provide an indication of a second state of the principal device;

FIGS. 7B–7E are diagrammatical views of alternative output circuits for the auxiliary switch.

DETAILED DESCRIPTION OF THE PRESENTLY PREFERRED EMBODIMENTS

Figure 1:
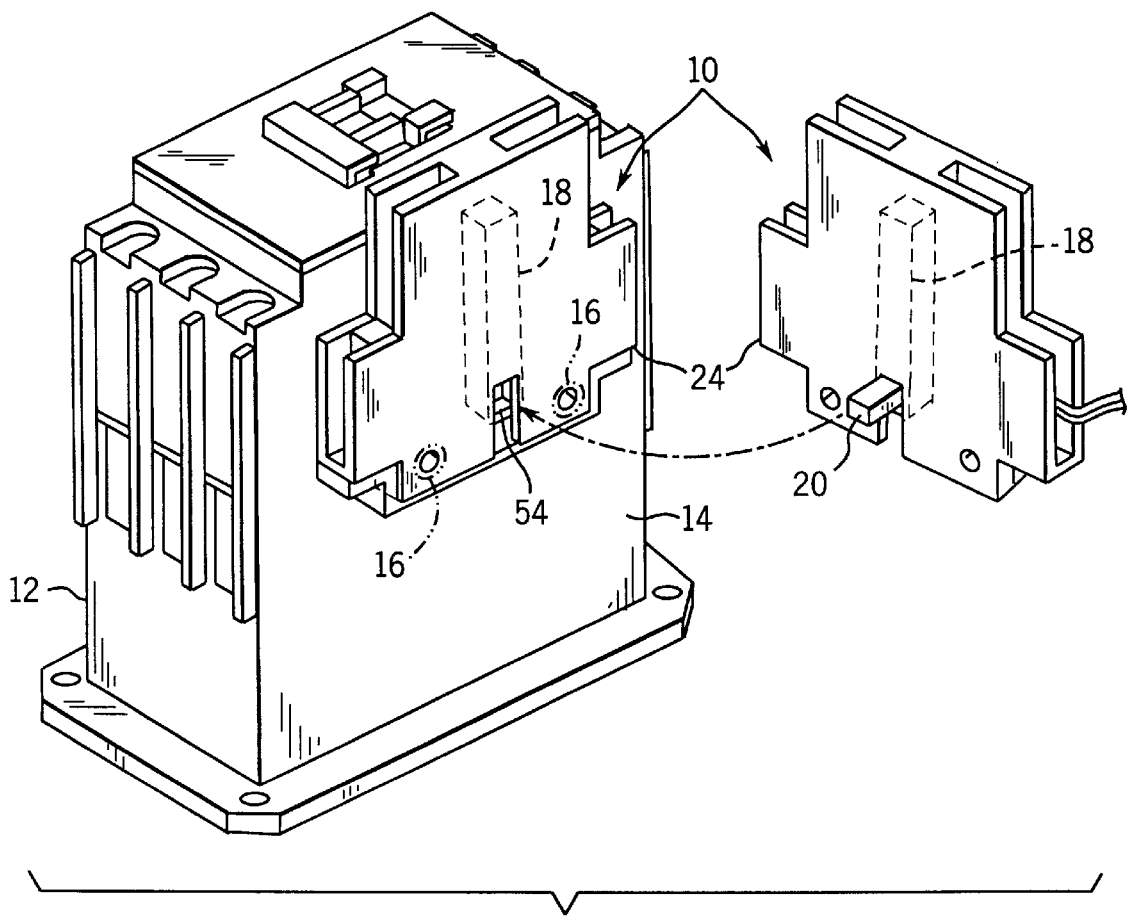
FIG. 1 is a perspective view of a modular auxiliary switch in accordance with one aspect of the invention, illustrating a preferred arrangement for mounting the auxiliary switch to a principal switching device.

Turning now to the figures and referring first to FIG. 1, an auxiliary switch device, designated generally by the reference numeral 10, is illustrated and positioned adjacent to a principal switching device 12. In the illustrated embodiment, switching device 12 is a three phase contactor of a type available commercially from Allen-Bradley Company, Inc. of Milwaukee, Wis., under the designations Bulletin 100 or 500. It should be noted however that, while throughout the following description, reference is made to a switching device in the form of a three phase contactor, auxiliary switch 10 may be employed with a variety of electrical or nonelectrical devices for indicating their position or state. However, in the preferred embodiment, auxiliary switch 10 is adapted for coupling directly to an enclosure of such a switching device for providing feedback signals indicative of the state (i.e., open or closed) of current carrying paths through the device.

Auxiliary switch 10 may be secured directly to a side panel 14 of device 12 by screws or similar fasteners (not shown). Additional modular switches may be supported on device 12 by additional screws (shown in broken lines in FIG. 1), as described in greater detail below. In the preferred embodiment illustrated, auxiliary switch 10 includes a moveable actuator bar 18 from which an interface extension 20 protrudes. Interface extension 20 is arranged for insertion through an aperture in switching device 12 for linking actuator bar 18 to a moveable element within switching device 12. Movable elements to which extension 20 may be coupled include movable contact carriers or similar components within device 12. In general, such switching devices may be manually or remotely operated, such as by energizing a coil or a similar actuator (not shown) to move moveable contacts or other moveable elements from a spring-biased position to an actuated position. Such positions typically correspond to conducting and non-conducting configurations of switching device 12.

It should be noted that in the illustrated embodiment, auxiliary switch 10 is formed as a modular unit which can be fitted to device 12. As shown in FIG. 1, switch 10 also permits additional auxiliary switches 10 to be stacked on device 12 and interfaced with one another for actuation. Thus, two or more auxiliary switches 10 may be employed to provide feedback or control signals based upon the state of principal device 12. Moreover, where a plurality of modular auxiliary switches 10 are employed, some or all of these may be configured as optically sensing switches as described herein, while others are configured in accordance with conventional designs.

Auxiliary switch 10 includes a modular enclosure 24 comprising two separable and mating shell elements which enclose and support mechanical and electronic components of switch 10. FIGS. 2 and 4 illustrate an example of the manner in which certain components of switch 10 may be disposed within enclosure 24. In particular, enclosure 24, as illustrated in FIG. 2, supports several terminal connections or leads, including a common terminal 26, a normally open terminal 27 and a normally closed terminal 28. Terminals 26–28 are configured for coupling to a control or monitoring circuit for providing signals indicative of the position of actuator bar 18. A power supply circuit, designated generally by the reference numeral 30, is also supported within enclosure 24 to provide power for switch 10 as described more fully below. Power supply lines I furnish power to circuit 30, such as from an external a.c. power source. Power supply circuit 30 is coupled to an optical switch set 32 within enclosure 24. Switch set 32 includes an optical emitter 34 and an optical detector 36 aligned in facing relation with respect to one another (see the partial sectional view of FIG. 3). An optical shield 38 is supported by actuator bar 18 and extends in a direction toward emitter 34 and detector 36. An output circuit 40 is also provided in enclosure 24 and may assume various forms as desired for particular applications, as described below with reference to FIGS. 7A–7E.

Returning to FIGS. 2, 3 and 4, while the actuating components of switch 10 may be arranged in a number of manners, in a preferred embodiment, actuator bar 18 is slidably supported in enclosure 24 by guide walls 42.

Emitter 34 and detector 36 are supported on a support wall or printed circuit board 44, which also serves to support electrical conductors leading to and from emitter 34 and detector 36. Shield 38 is supported on actuator bar 18 and is slidable with bar 18 within enclosure 24. A biasing spring 46 contacts a lower region 48 of actuator bar 18 to urge actuator bar 18 upwardly into the position illustrated in FIG. 2. In the illustrated embodiment, biasing spring 46 is a torsion spring supported on a post 50 formed within enclosure 24. A lower extension of spring 46 bears against an abutment 52 within enclosure 24.

To permit a plurality of modular switches 10 to be stacked on a principal device 12, a recess 54 is formed in a rear region of actuator bar 18 opposite interface extension 20, as best illustrated in FIG. 3. Recess 54 is preferably similar to a recess formed in a movable element within device 12, and receives an interface extension 20 of a similar auxiliary switch 10 when more than one feedback or control signal is desired. The additional interfaced modular switch 10 is thereby actuated by the actuator bar 18 of a similar switch in the same manner as by the movable element of principal device 12.

Figure 5:
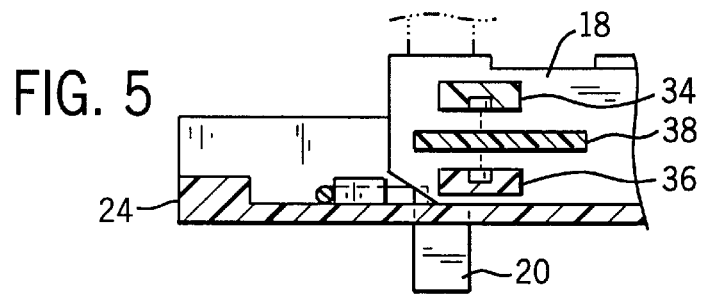
FIG. 5 is a sectional view of the emitter, detector and shield arrangement illustrated in FIG. 2 taken along line 5—5 of that Figure.

In the biased position illustrated in FIG. 2, shield 38 extends between emitter 34 and detector 36 to interrupt or open the optical path therebetween. The upward movement of actuator bar 18 and shield 38 is stopped by abutment of the upper end 56 of bar 18 against a stop 58, which may be integral with one or more guide walls 42. As best illustrated in FIG. 3, shield 38 extends in a plane between planes of emitter 34 and detector 36 so as to be slidable therebetween without contacting either component. FIG. 5 illustrates the relative position of these elements in the biased position of bar 18. As shown in FIG. 5, in this position, shield 38 is disposed between emitter 34 and detector 36.

Figure 6:
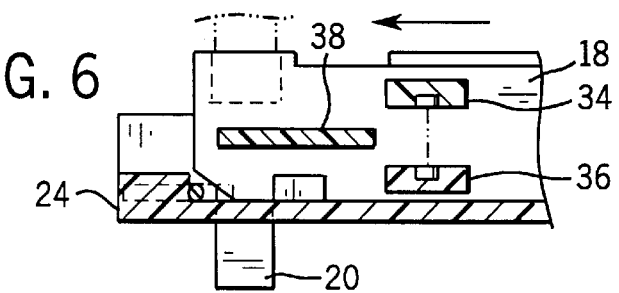
FIG. 6 is a sectional view of the emitter, detector and shield arrangement in the displaced position of FIG. 4 taken along line 6—6 of that Figure.

When principal device 12 is shifted between operational states, actuator bar 18 is physically displaced within enclosure 24 to change the state of auxiliary switch 10. Thus, as shown in FIG. 4, actuator bar 18 is displaced downwardly against the force of biasing spring 46, guided in its movement by guide walls 42. In this actuated position, optical shield 38 is moved out of the optical path defined between emitter 34 and detector 36, as shown in FIG. 6. Optical emissions from emitter 34 may thus be detected by detector 36 to change the state of an output signal from switch 10 as described below.

Figure 7A:
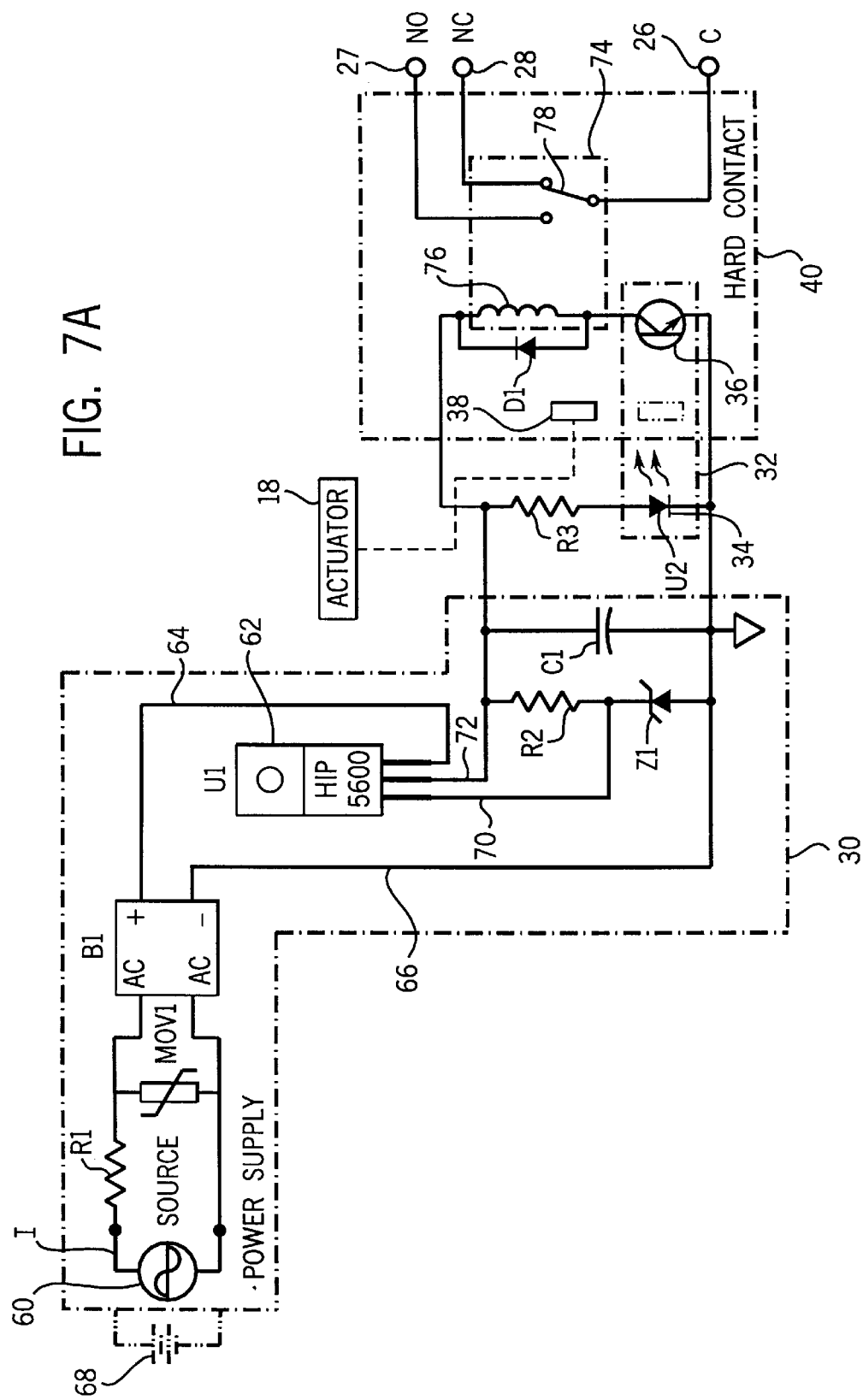
FIG. 7A is a diagrammatical view of electrical components of the auxiliary switch and their interconnection.

Presently preferred electrical circuitry of switch 10 is illustrated in FIG. 7A. As shown in that Figure, power supply circuit 30 furnishes power to optical switch set 32 to change the logical state of output circuit 40. Power supply circuit 30 includes a power source 60, such as an external a.c. power source coupled to conductors I, for supplying power to switch set 32, as well as a linear power supply 62 for providing power needed for output circuit 40. In the embodiment illustrated, source 60 receives incoming power from an alternating current power source, and includes a 100 ohm resistor R1, a metal oxide varistor MOV1, and a 1000 volt full wave bridge B1. In operation, resistor R1, varistor MOV 1 and bridge B1 convert the incoming power to direct current power which is output from bridge B1 via conductors 64 and 66. It should be noted that power source 60 may alternatively include a direct current power supply 68, as shown in broken lines in FIG. 7A. In the embodiment illustrated, bridge B1 outputs d.c. power at between 50 and 400 volts.

It should also be noted that while incoming power for power supply circuit 30 may be from the same source as that to which principal switching device 12 is coupled, in many applications it will be desirable to separately power auxiliary switch 10. Thus, in the event of a malfunction in the circuitry to which device 12 is coupled, such as resulting from an overload condition, auxiliary switch 10 will remain operational for supplying a feedback signal representative of the actual position or logical state of device 12.

Power supply 62 is coupled to conductors 64 and 66, and to optical switch set 32 via signal conditioning circuitry, including a resistor R2, a Zener diode Z1, a capacitor C1, and a resistor R3. In the presently preferred embodiment, power supply 62 is a HIP5600 supply which applies 24 volt, 15 mAmp power along output conductors 66 and 72. Resistor R2 is a 10 Kohm resistor, while diode Z1 is a model 1N4749, 24 volt Zener diode. Capacitor C1, which is coupled in parallel with resistor R1 and diode Z1, is a 10 microfarad, 25 volt capacitor. Resistor R3 is a 3.3 Kohm resistor. These components, interconnected as shown in FIG. 7A, supply power to optical emitter 34, to optical detector 36, and to output circuit 40.

In the embodiment shown in FIG. 7A, output circuit 40 includes components for making a hard contact for producing an output signal representative of the logical state of switch 10. Thus, circuit 40 may comprise a relay circuit 74, including a relay coil 76 and switch 78. A diode D1 is coupled in parallel with coil 76 as shown in FIG. 7A. Coil 76 is coupled in series with optical detector 36. In the illustrated embodiment, diode D1 is a model 1N194 diode, while relay coil 76 is a 24 volt, 3850 ohm coil. Switch 78 is a double pole, single throw switch coupled to common terminal 26, and to normally open and normally closed terminals, 27 and 28, permitting output circuit 40 to be wired for normally open or normally closed operation.

In operation, actuator 18 is biased into its normal position described above, withdrawing shield 38 from the optical path between emitter 34 and detector 36. Optical emissions from emitter 34 are thus detected by detector 36, energizing relay coil 76 to draw output switch 78 to its normal operating position. When actuator 18 is displaced by a change in state of principal switching device 12, shield 38 is placed between emitter 34 and detector 36 as shown in broken lines in FIG. 7A. As a result, detector 36 changes conducting states, de-energizing coil 76 and shifting switch 78. Control and monitoring circuitry coupled to terminals 26–28 is thus provided with an output signal indicative of the logical state of switch 10, and thereby of the state of device 12. It has been found that switch set 32 is particularly tolerant to the collection of dirt and debris, reliably producing output signals even in relatively contaminated environments.

Various alternative embodiments may be envisaged for the electrical components and circuits described above. In particular, the power supply circuitry and output circuitry described above may be modified depending upon the particular application and the type of input and output signals desired. FIGS. 7B–7E represent several such alternative configurations of output circuit 40. By way of example, as shown in FIG. 7B, rather than a relay and hard contact switch, output circuit 40 may include a triac circuit, designated generally by the reference numeral 80. Triac circuit 80 may include a photoemitter and detector arrangement that produces an output signal at terminals 82 and 84 when the optical path within optical emitter and detector 34 and 36 is closed. Alternatively, as shown in FIG. 7C, output circuit 40 may include a simple transistor circuit 86, wherein output terminals 82 and 84 are coupled directly to optical detector 36, completing a current carrying path through detector 36 when the optical path with emitter 34 is closed.

As a further alternative, output circuit 40 may comprise a transistor-transistor logic (TTL) circuit 88, including a plurality of transistors in cascade to produce an output signal, such as a 5 volt signal, between terminals 82 and 84 when detector 36 senses emissions from emitter 34. As a further alternative, output circuit 40 may include an infrared (IR) circuit 90, comprising an infrared output device coupled, such as via an optical signal path, to a photodiode in series with detector 36.

In addition to variations on the electrical circuitry, switch 10 may include various physical structures for interrupting and completing the optical path between emitter 34 and detector 36 upon a change in state of principal device 12. For example, actuator 18 may be movable within enclosure 24 in different directions depending upon the construction of principal device 12. Moreover, rather than slide linearly within enclosure 24, actuator 18 may pivot or rotate to move shield 38 to positions for opening and closing the optical path between emitter 34 and detector 36. Additionally, while in the embodiment described above actuator 18 supports and displaces shield 38 with respect to a stationary optical switch set 32, arrangements may be envisaged wherein switch set 32 is displaced with respect to a stationary shield, or wherein both elements are displaced with respect to one another.

While the embodiments illustrated in the Figures and described above are presently preferred, it should be understood that these embodiments are offered by way of example only, and not as limitations on the invention. The present invention is intended to extend to the fill scope afforded by the appended claims and the prior art.

What is claimed is:

1. An auxiliary switch for providing a signal indicative of a state of a principal switching device, the principal switching device including an enclosure and a movable element displaceable within the enclosure to establish first and second states of the principal switching device, the auxiliary switch comprising:

an actuator including an interface element configured for coupling to the principal switching device movable element, the interface element moving the actuator with the movable element;

an optical switch set including an emitter and a detector;

an optical shield coupled to the actuator, the optical shield being movable with the actuator between a first position intermediate the emitter and detector to interrupt an optical path between the emitter and detector and thereby to provide an indication of the first state of the principal switching device, and a second position displaced from the first position to open an optical path between the emitter and detector and thereby to provide an indication of the second state of the principal switching device; and a modular housing configured to be secured to the principal switching device, the actuator, the optical switch and the optical shield being disposed in the housing.

2. The auxiliary switch of claim 1, wherein the interface element extends from the housing to interface with the principal switching device.

3. The auxiliary switch of claim 2, wherein the modular housing is configured to mate with a similar modular housing of a second auxiliary switch.

4. The auxiliary switch of claim 1, further comprising a power supply circuit coupled to the optical switch, the power supply circuit applying power to the optical switch for generating an output signal when the optical path between the emitter and detector is open.

5. The auxiliary switch of claim 4, wherein the detector includes a solid state switch powered by the power supply circuit, the solid state switch changing conducting states based upon whether the optical path between the emitter and detector is open or closed.

6. The auxiliary switch of claim 1, further comprising an output circuit coupled to the optical switch, the output circuit being configured to generate an output signal representative whether the optical path between the emitter and detector is open or closed.

7. The auxiliary switch of claim 6, wherein the output circuit includes a relay coil and switching element, the switching element being movable under the influence of the relay coil to complete and interrupt a current carrying path to generate the output signal.

8. The auxiliary switch of claim 6, wherein the output circuit includes a triac circuit.

9. The auxiliary switch of claim 6, wherein the output circuit includes a low voltage TTL circuit.

10. The auxiliary switch of claim 6, wherein the output circuit includes an infrared emitter and detector set, the infrared emitter emitting an infrared signal to generate the output signal.

11. A modular auxiliary switch for providing a signal indicative of a state of a principal switching device, the principal switching device including an enclosure and a movable element displaceable within the enclosure to establish first and second states of the principal switching device, the auxiliary switch comprising:

a modular housing configured to be coupled to the enclosure of the principal switching device;

an actuator movable within the modular housing and including an interface element configured for coupling to the principal switching device movable element, the interface element moving the actuator with the movable element;

an optical switch set disposed within the modular housing and including an emitter and a detector; and an optical shield disposed within the modular housing and coupled to the actuator, the optical shield being movable with the actuator between a first position intermediate the emitter and detector to interrupt an optical path between the emitter and detector and thereby to provide an indication of the first state of the principal switching device, and a second position displaced from the first position to open an optical path between the emitter and detector and thereby to provide an indication of the second state of the principal switching device.

12. The modular auxiliary switch of claim 1, wherein the interface element of the actuator extends from the modular housing to contact the movable element of the principal switching device.

13. The modular auxiliary switch of claim 11, wherein the modular housing is configured to interface with a similar modular housing of a second auxiliary switch, whereby a plurality of modular switches may be coupled to the principal switching device.

14. The modular auxiliary switch of claim 11, further comprising a power supply circuit disposed within the modular housing and coupled to the optical switch, the power supply circuit applying power to the optical switch for generating an output signal when the optical path between the emitter and detector is open.

15. A method for monitoring an operating state of a principal switching device, the principal switching device including an enclosure and a movable element displaceable within the enclosure to establish first and second states of the principal switching device, the method comprising the steps of:

(a) providing an optical switching unit in a modular housing, the optical switching unit including an actuator, an optical switch, and an optical shield associated with the actuator, the optical switch including an optical emitter and an optical receiver;

(b) coupling the modular housing to the principal switching device such that the actuator is movable with the movable element;

(c) establishing an optical path between the optical emitter and the optical receiver;

(d) selectively interrupting the optical path with the optical shield based upon the state of the principal switching device; and (e) generating an output signal representative of whether the optical path is open or closed to provide an indication of the state o the principal switching device.

16. The method of claim 15, wherein the optical switching unit is electrically coupled to produce the output signal when the optical path is open.

17. The method of claim 15, wherein the optical switching unit is electrically coupled to produce the output signal when the optical path is closed.

18. The method of claim 15, comprising the further step of changing a logical state of a solid state switching device based upon the output signal.

19. The method of claim 15, wherein the optical switch is fixed in a predetermined position and the optical shield is displaced with respect to the optical switch to open and close the optical path.

20. The method of claim 19, wherein the optical shield is coupled to an actuator within an auxiliary switch housing, the actuator being coupled to the movable element of the principal switching device to displace the actuator and optical shield with respect to the optical switch as the movable element is displaced within the principal switching device.

* * * * *